United States Patent

[11] 3,544,704

[72] Inventors Thomas P. Glenn, Jr.
Phoenix;
Richard E. Shipley, Tempe, Arizona

[21] Appl. No. 792,437
[22] Filed Jan. 21, 1969
[45] Patented Dec. 1, 1970
[73] Assignee Motorola Inc.
Franklin Park, Illinois
a corporation of Illinois

[54] BONDING ISLANDS FOR HYBRID CIRCUITS
5 Claims, 3 Drawing Figs.

[52] U.S. Cl. .......... 174/68.5; 29/589, 29/626; 317/101, 317/234
[51] Int. Cl. .......... H05k 1/02
[50] Field of Search .......... 174/68.5; 317/101(A), 101(B), 101(CC), 101(CM), 101(D); 29/626, 588-591; 317/234(5), 235(22.11).

[56] References Cited
UNITED STATES PATENTS
2,834,701 5/1958 Gudmundsen et al. ....... 317/234.5X

*Primary Examiner*—Darrell L. Clay
*Attorney*—Mueller, Aichele & Rauner

ABSTRACT: A silicon bonding island connected to a gold-plated substrate is disclosed. The silicon bonding island is a silicon wafer substrate which has an upper layer of aluminum or gold to which aluminum or gold leads are connected. On the other side of the silicon substrate is a layer of gold, silver or aluminum which is bonded to a gold plated substrate.

INVENTORS
Thomas P. Glenn, Jr. &
Richard E. Shipley
BY
Mueller, Aichele, & Rauner
Atty's

BONDING ISLANDS FOR HYBRID CIRCUITS

BACKGROUND OF THE INVENTION

This invention relates to bonding islands for hybrid circuits and more particularly to a bonding island containing a silicon wafer substrate.

A bonding island is a relatively large metallic area on a gold-plated substrate which is connected by means of a thin metallic strip to some specific point in the circuit to which an external connection is made. Bonding islands are necessary because it is impossible to make the internal and external connections directly to the discrete components due to the complexities of the circuits. Heretofore, the most widely used bonding island consisted of a molybdenum chip having an upper surface coated with a layer of aluminum to which aluminum wires are connected thereto. The underside of this molybdenum chip is gold-plated and is bonded to a gold-plated substrate by the use of a gold-germanium preform. The gold-germanium preform is necessary to form a tight bond between the bonding island and the gold-plated substrate. This gold-germanium preform is bonded to the top of the gold-plated substrate by a heating step referred to as die bonding to the substrate. This step of die bonding to the substrate is costly and undesirable but necessary in order to obtain a good bond between the molybdenum chip bonding island and the gold-plated substrate.

SUMMARY OF THE INVENTION

It is an object of this invention to provide an improved bonding island. It is another object of this invention to provide a bonding island which can be more easily bonded to a gold-plated substrate.

These and other objects are accomplished by the use of a bonding island consisting of a silicon wafer substrate having the upper surface coated with a layer of aluminum or gold and the lower surface coated with a layer of gold, silver or aluminum. The lower surface metal layer is bonded to a gold-plated substrate. A specific example of a bonding island in accordance with this invention is a silicon wafer substrate having the upper surface coated with a layer of aluminum and the lower surface coated with a layer of gold. Aluminum or gold leads are connected to the bonding island aluminum layer. The bonding island gold layer is bonded directly to a gold-plated substrate.

Further objects and advantages of the present invention will be apparent from the following detailed description, reference being had to the drawings wherein the preferred embodiment of the present invention is clearly shown.

IN THE DRAWINGS

DESCRIPTION OF A PREFERRED EMBODIMENT

Figure 1:
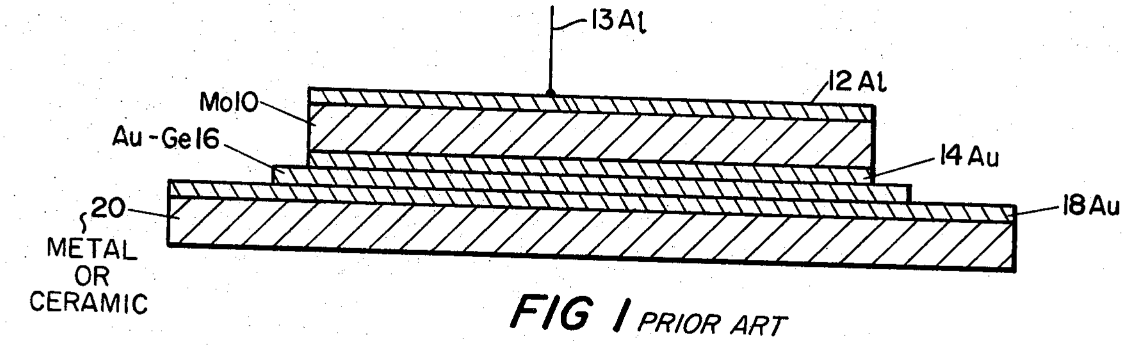
FIG 1 PRIOR ART
FIG. 1 is a cross-sectional view of a prior art bonding island.

Referring now to the drawings, FIG. 1 shows a widely used prior art bonding island consisting of a molybdenum chip 10 having a layer of aluminum 12 thereon and the lower surface covered with a layer of gold 14. Connected to the aluminum layer 12 is an aluminum wire 13. A layer of a eutectic alloy suitable for braizing purposes such as gold-germanium preform 16 is positioned beneath the gold layer 14. A gold-plated substrate consisting of a layer of gold 18 and a substrate 20 such as a metal or a ceramic, for example, alumina, supports the bonding island. The molybdenum bonding island is bonded to the gold-plated substrate 20 by means of a gold-germanium preform 16 which combines with the molybdenum bonding island gold layer 14 and the substrate gold layer 18.

Figure 2:
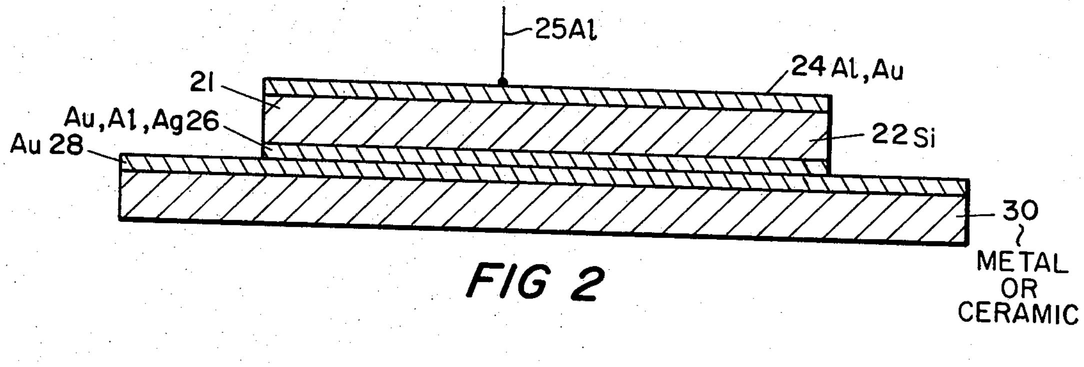
FIG. 2 is a cross-sectional view of a bonding island in accordance with this invention.

In accordance with this invention as shown in FIG. 2, the silicon bonding island 21 consists of a silicon wafer substrate 22 having an upper metal layer 24. The metal layer 24 of the bonding island is aluminum or gold with the preferred metal being aluminum. Aluminum is preferred because of its low cost and its ability to bond well with aluminum wires. The thickness of the upper metal layer 24 is only critical in the sense that there must be sufficient material present to produce the desired mechanical bond with the wires. An aluminum layer thickness of 13,000 to 20,000 Angstrom units is used in the preferred embodiment.

The silicon wafer substrate has a lower metal layer 26 bonded thereto. This metal layer may be gold, aluminum or silver with gold being the preferred metal. The lower metal layer is bonded to a gold layer 28 of the substrate 30 thereby connecting the bonding island to the substrate. Gold is the preferred metal for the lower layer since no braizing alloy is required to bond it to the gold-plated substrate. When aluminum or silver are used as the lower layer, it is necessary to use a gold-germanium preform or some similar eutectic mixture in order to bond the bonding island to the gold-plated substrate. The thickness of the lower metal layer 26 is only critical in the sense that there must be sufficient material present to produce the desired mechanical bond with the substrate gold layer 28.

The substrate in this structure is not critical and any of the conventionally used metal substrates, such as Kovar and nickel, or ceramic substrates, such as alumina, beryllia, mullite, steatite and the like, may be used.

Connected to the metal layer 24 is a metal wire 25. The metal wire 25 is aluminum or gold with aluminum being used in the preferred embodiment.

The invention will now be described in detail in terms of forming a silicon chip bonding island having an aluminum upper layer and a gold lower layer suitable for use in hybrid circuits. A silicon wafer is cleaned by conventional techniques, such as cleaning with hydrofluoric acid. After this cleaning step, aluminum metal is evaporated onto the upper layer of the silicon wafer by vacuum evaporation, sputtering or other suitable methods well known in the art. After the upper layer of aluminum has been formed, the wafer is then turned over so that the other surface may be coated with gold. This gold coating is again formed by conventional coating techniques, such as vacuum evaporation, sputtering, and the like. After the silicon wafer has an aluminum layer on one side and a gold layer on the other side, the coated wafer is subjected to a heating step in an inert atmosphere, such as nitrogen, to form a strong bond between the silicon and the metal layers. Argon, hydrogen and helium and other inert atmospheres may be used. The coated silicon wafer is then scribed into dies and broken into the individual dies. These individual dies are then placed on a gold-plated substrate in a hybrid circuit as needed. These silicon bonding islands are then bonded to the gold-plated substrate by a heating step which bonds the gold substrate layer to the gold layer of the bonding island. Aluminum or gold wires are then bonded to the upper bonding island metal layer by conventional methods well-known in the art.

Figure 3:
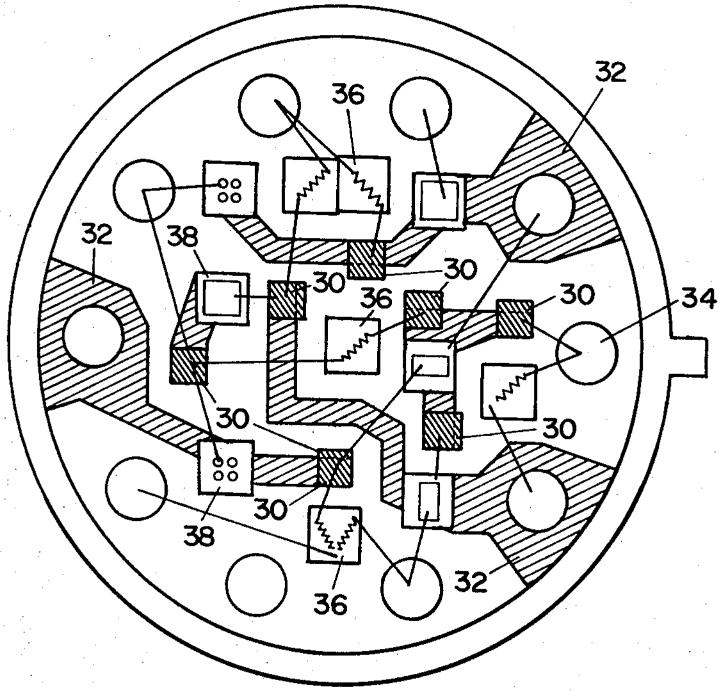
FIG. 3 is a perspective view of an acceptance gate generator having bonding islands therein.

As shown in FIG. 3, an acceptance gate generator, bonding islands 30 are bonded to gold-plated substrate portions 32. The bonding islands 30 are connected to header post 34, resistor dies 36 and diodes 38.

The use of the silicon chip has several advantages over the prior art method which used molybdenum as the bonding island. The use of silicon bonding islands reduces the cost of the bonding islands since scrap silicon material may be used. The use of scrap silicon material greatly reduces the cost of the bonding islands. Another advantage is that in the preferred embodiment of this invention in which the silicon bonding island has a layer of gold thereon, it is not necessary to tin the ceramic, that is, to use a gold-germanium preform or other similar braizing material in order to effect the bond between the bonding island chip and the gold-plated substrate. By eliminating this tinning step in bonding a gold-germanium preform to the substrate in the preferred embodiment, a substantial savings is effected. Moreover, the reliability of the subject invention is better since the aluminum surface matches the aluminum bonding pads of the die.

While the invention has been described in terms of a preferred embodiment, it is to be understood that the invention is defined by the following claims.

We claim:

1. The combination of a bonding island and a gold-plated substrate, said bonding island comprising a silicon wafer substrate having a first surface coated with a layer of a metal taken from the group consisting of aluminum and gold, said silicon wafer substrate having a second surface coated with a layer of a metal taken from the group consisting of gold, aluminum and silver, said second surface metal layer being bonded to said gold-plated substrate.

2. The combination as described in claim 1 wherein said first surface is coated with a layer of aluminum.

3. The combination as described in claim 1 wherein said second surface is coated with a layer of gold.

4. The combination as described in claim 1 wherein said substrate is sintered alumina.

5. A combination of a bonding island, an aluminum lead and a gold-plated substrate, said bonding island comprising a silicon wafer substrate having a first surface coated with a layer of aluminum, said aluminum lead being connected to said aluminum layer, said silicon substrate having a second surface coated with a layer of gold, said gold layer being bonded to said gold-plated substrate.